United States Patent
Hori et al.

(10) Patent No.: US 9,595,657 B2
(45) Date of Patent: Mar. 14, 2017

(54) COMPOSITE SUBSTRATE

(71) Applicant: NGK INSULATORS, LTD., Aichi (JP)

(72) Inventors: Yuji Hori, Owariasahi (JP); Tomoyoshi Tai, Inazawa (JP); Akiyoshi Ide, Kasugai (JP); Sugio Miyazawa, Kasugai (JP)

(73) Assignee: NGK INSULATORS, LTD., Aichi (JP)

( * ) Notice: Subject to any disclaimer, the term of this patent is extended or adjusted under 35 U.S.C. 154(b) by 68 days.

(21) Appl. No.: 14/561,622

(22) Filed: Dec. 5, 2014

(65) Prior Publication Data

US 2015/0102707 A1   Apr. 16, 2015

Related U.S. Application Data

(63) Continuation of application No. PCT/JP2013/066089, filed on Jun. 11, 2013.
(Continued)

(51) Int. Cl.
*H03H 9/25* (2006.01)
*H01L 41/08* (2006.01)
(Continued)

(52) U.S. Cl.
CPC .......... *H01L 41/081* (2013.01); *H01L 41/053* (2013.01); *H01L 41/313* (2013.01);
(Continued)

(58) Field of Classification Search
CPC ............................ H03H 9/25; H03H 9/02574
See application file for complete search history.

(56) References Cited

U.S. PATENT DOCUMENTS 4,471,258 A * 9/1984 Kumada ............... H04R 17/00
                                                              310/345
5,001,093 A    3/1991 Roy et al.
(Continued)

FOREIGN PATENT DOCUMENTS

JP       07-038360 A    2/1995
JP    2000-022488 A    1/2000
(Continued)

OTHER PUBLICATIONS

English translation of International Preliminary Report on Patentability for PCT Patent App. No. PCT/JP2013/066089 (Dec. 24, 2014).
(Continued)

*Primary Examiner* — J. San Martin
(74) *Attorney, Agent, or Firm* — Cermak Nakajima & McGowan LLP; Tomoko Nakajima

(57) ABSTRACT

A composite substrate 10 includes a supporting substrate 12 and a piezoelectric substrate 14 which are bonded to each other. In this embodiment, the supporting substrate 12 and the piezoelectric substrate 14 are bonded to each other by an adhesive layer 16. In the composite substrate 10, since the supporting substrate 12 is composed of a translucent alumina ceramic, alignment is easily performed during FCB compared with the case where the supporting substrate is composed of an opaque ceramic. Furthermore, preferably, the linear transmittance and the total light transmittance from the front of the supporting substrate 12 in the visible light range (360 to 750 nm) are 10% or more and 70% or more, respectively.

7 Claims, 7 Drawing Sheets

Related U.S. Application Data

(60) Provisional application No. 61/658,988, filed on Jun. 13, 2012.

(51) Int. Cl.
  *H01L 41/313* (2013.01)
  *H01L 41/053* (2006.01)
  *H03H 9/02* (2006.01)
  *H01L 41/187* (2006.01)

(52) U.S. Cl.
  CPC ........... *H03H 9/25* (2013.01); *H01L 41/1873* (2013.01); *H03H 9/02574* (2013.01)

(56) References Cited

U.S. PATENT DOCUMENTS

| | | | |
|---|---|---|---|
| 6,306,788 B1* | 10/2001 | Watanabe | C04B 35/115 264/674 |
| 2003/0181311 A1* | 9/2003 | Tanaka | B32B 18/00 501/135 |
| 2004/0046248 A1 | 3/2004 | Waelti et al. | |
| 2010/0252950 A1 | 10/2010 | Yoshimura et al. | |
| 2011/0278993 A1* | 11/2011 | Iwamoto | H03H 3/02 310/345 |
| 2012/0091856 A1 | 4/2012 | Tsuji et al. | |
| 2012/0231218 A1 | 9/2012 | Nakayama et al. | |
| 2014/0191373 A1* | 7/2014 | Iwasaki | H01L 21/76251 257/618 |

FOREIGN PATENT DOCUMENTS

| | | |
|---|---|---|
| JP | 2004-284877 A | 10/2004 |
| JP | 2005-191283 A | 7/2005 |
| JP | 2006-319679 A | 11/2006 |
| JP | 2007-214902 A | 8/2007 |
| JP | 2010-154315 A | 7/2010 |
| JP | 2011-066818 A | 3/2011 |
| JP | 2012-109399 A | 6/2012 |
| WO | WO2011/034136 A1 | 3/2011 |

OTHER PUBLICATIONS

International Search Report for PCT Patent App. No. PCT/JP2013/066089 (Sep. 10, 2013).
Written Opinion for PCT Patent App. No. PCT/JP2013/066089 (Sep. 10, 2013).
Supplementary European Search Report for European Patent App. No. 13804294.0 (Jan. 25, 2016).
Office Action from Korean Patent App. No. 9-5-2016-055823118 issued Aug. 2, 2016.
Office Action from Taiwanese Patent App. No. 102120856 issued Jul. 12, 2016.

* cited by examiner

Cavity

COMPOSITE SUBSTRATE

BACKGROUND OF THE INVENTION

1. Field of the Invention

The present invention relates to a composite substrate.

2. Description of the Related Art

It has been known to manufacture an elastic wave device by providing electrodes on a composite substrate in which a supporting substrate and a piezoelectric substrate are bonded to each other. The elastic wave device is used, for example, as a band pass filter in communication equipment, such as a mobile phone. Furthermore, in a known composite substrate, a piezoelectric substrate is composed of lithium niobate or lithium tantalate and a supporting substrate is composed of silicon, quarts, or a ceramic (refer to Patent Literature 1). Examples of the ceramic described therein include those widely used as a package material.

CITATION LIST

Patent Literature

PTL 1: Japanese Unexamined Patent Application Publication No. 2006-319679

SUMMARY OF INVENTION

Technical Problem

However, in the known composite substrate, since the supporting substrate is composed of an opaque ceramic, it is difficult to perform alignment during flip chip bonding (FCB), which is a problem. Specifically, as shown in FIG. 6, during FCB, a composite substrate 110 in which a supporting substrate 112 and a piezoelectric substrate 114 are bonded to each other is arranged such that the piezoelectric substrate 114 is on the lower side and the supporting substrate 112 is on the upper side, and it is necessary to perform alignment between ball bumps 114a formed of Au on the piezoelectric substrate 114 and electrode pads 102a on a printed circuit board 102. The alignment is performed while monitoring with a camera disposed on the supporting substrate 112 side. At this time, although the piezoelectric substrate 114 is transparent, the supporting substrate 112 is composed of an opaque ceramic, and therefore, it is not easy to perform alignment through the supporting substrate 112.

The present invention has been achieved in order to solve the problem described above, and it is a main object of the invention to provide a composite substrate in which alignment is easily performed during FCB.

Solution to Problem

A composite substrate of the present invention includes a supporting substrate and a piezoelectric substrate which are bonded to each other, wherein the supporting substrate is composed of a translucent ceramic.

In the composite substrate of the present invention, alignment is easily performed during FCB compared with the case where the supporting substrate is composed of an opaque ceramic. That is, in general, the piezoelectric substrate is transparent; and during FCB, the piezoelectric substrate is placed on the lower side, and the supporting substrate is placed on the upper side. Since the supporting substrate is composed of a translucent ceramic, it is possible to check the position of the piezoelectric substrate (e.g., positions of ball bumps provided on the piezoelectric substrate) through the supporting substrate. Therefore, alignment is easily performed.

In the composite substrate of the present invention, preferably, the linear transmittance and the total light transmittance from the front of the supporting substrate in the visible light range (360 to 750 nm, hereinafter the same) are 10% or more and 70% or more, respectively. In this case, the advantage of the present invention described above can be obtained more reliably.

In the composite substrate of the present invention, preferably, the total light transmittance from the front of the supporting substrate at a wavelength of 200 nm is 80% or more. In this case, when a photoresist film is formed on the surface of the piezoelectric substrate, and then exposure is performed on the photoresist film using UV with a wavelength in the vicinity of 200 nm, reflection at the interface between the piezoelectric substrate and the supporting substrate is suppressed, enabling high-accuracy patterning. Furthermore, since the resolution of an exposure apparatus is defined by $k \times \lambda / NA$ (where k denotes a coefficient, $\lambda$ denotes a wavelength of a light source, and NA denotes a numerical aperture of a projection lens), a fine pattern can be formed by performing exposure with a short wavelength. Preferably, at least one of front and back surfaces of the supporting substrate is a rough surface (e.g., with an arithmetic average roughness Ra of 5 to 20 nm). In this case, the value of the total light transmittance from the front at a wavelength of 200 nm increases compared with the case where the front and back surfaces are mirror surfaces (e.g., with an arithmetic average roughness Ra of 0.5 to 2 nm). In particular, preferably, both surfaces of the supporting substrate are rough surfaces because the value of the total light transmittance from the front at a wavelength of 200 nm further increases.

In the composite substrate of the present invention, preferably, the supporting substrate and the piezoelectric substrate are bonded to each other through an adhesive layer, and the refractive index of the adhesive layer is a value between the refractive index of the supporting substrate and the refractive index of the piezoelectric substrate. In this case, light radiated from above the piezoelectric substrate is more likely to pass through the adhesive layer and the supporting substrate.

In the composite substrate of the present invention, the supporting substrate may be provided with a cavity. The supporting substrate is obtained by forming starting materials for a translucent ceramic into a predetermined shape, followed by firing. Accordingly, when a supporting substrate provided with a cavity is formed, a mold by which a formed body provided with a cavity can be obtained is used. Consequently, masking and etching steps are not required. For example, in the case where a silicon substrate, not a translucent ceramic substrate, is used as the supporting substrate, a series of steps are required to form a cavity in the silicon substrate, which include, first, covering one surface (a surface opposite the surface that is to be bonded to a piezoelectric substrate) of the silicon substrate with a mask, exposing/developing the mask, and then etching portions not covered with the mask.

In the composite substrate of the present invention, preferably, the coefficient of thermal expansion of the supporting substrate is 4 to 9 ppm/° C. In this case, thermal expansion at high temperatures is small, and an excellent temperature characteristics-improving effect is obtained.

In the composite substrate of the present invention, preferably, the average crystal grain size of the supporting substrate is 10 to 50 μm. In this case, since the average crystal grain size is small, unwanted reflection of bulk waves can be reduced. Furthermore, the UV transmittance and strength are increased.

In the composite substrate of the present invention, preferably, the supporting substrate is composed of a translucent alumina ceramic. Characteristics of the supporting substrate composed of a translucent alumina ceramic are as follows:

Linear transmittance 10% or more in the visible light range

Total light transmittance from the front 70% or more in the visible light range (80% or more at a wavelength of 200 nm). This transmittance rises sharply on the wavelength side shorter than 300 nm.

Alumina purity 99.9% or more

Crystal grain size 10 to 50 μm

Coefficient of thermal expansion 4 to 9 ppm/° C.

DESCRIPTION OF EMBODIMENTS

Figure 1:
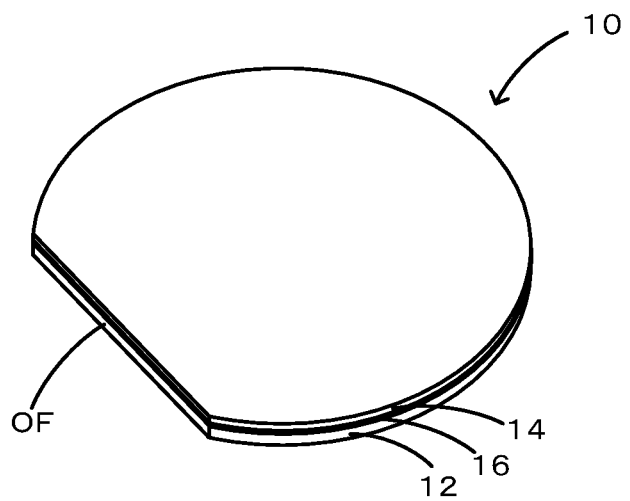
FIG. 1 is a perspective view schematically showing a structure of a composite substrate 10.

Embodiments of the present invention will be described below with reference to the drawings. FIG. 1 is a perspective view schematically showing a structure of a composite substrate 10 according to an embodiment of the present invention.

As shown in FIG. 1, the composite substrate 10 includes a supporting substrate 12 and a piezoelectric substrate 14 which are bonded to each other. In this embodiment, the supporting substrate 12 and the piezoelectric substrate 14 are bonded to each other by an adhesive layer 16. The composite substrate 10 is formed into a circular shape including a flat portion. The flat portion is referred to as the "orientation flat (OF)" and used for detecting the position and direction of the wafer, for example, when various operations are performed in the surface acoustic wave device fabrication process.

The supporting substrate 12 is a translucent alumina ceramic substrate with an alumina purity of 99% or more and a coefficient of thermal expansion of 4 to 9 ppm/° C. The linear transmittance of the supporting substrate 12 in the visible light range is 10% or more. Furthermore, the total light transmittance from the front of the supporting substrate 12 in the visible light range is 70% or more, and at a wavelength of 200 nm, 80% or more, preferably 85% or more, and more preferably 90% or more. The arithmetic surface roughness Ra of each of both surfaces of the supporting substrate 12 is 0.5 to 20 nm. Preferably, one surface of the supporting substrate 12 is a mirror surface (e.g., Ra of 0.5 to 2 nm) and the other surface of the supporting substrate 12 is a rough surface (e.g., Ra of 5 to 20 nm) because the total light transmittance from the front increases compared with the case where both surfaces of the supporting substrate 12 are mirror surfaces. More preferably, both surfaces are rough surfaces because the total light transmittance from the front further increases. The average crystal grain size of the supporting substrate 12 is 10 to 50 μm.

The piezoelectric substrate 14 is a substrate formed of a piezoelectric body capable of propagating elastic waves (e.g., surface acoustic waves). Examples of the material for the piezoelectric substrate 14 include lithium tantalate, lithium niobate, lithium borate, and quartz. These materials have a coefficient of thermal expansion of 13 to 16 ppm/° C. Such a piezoelectric substrate 14 is transparent.

The adhesive layer 16 is a layer that bonds the supporting substrate 12 and the piezoelectric substrate 14. The material for the adhesive layer 16 is not particularly limited, but is preferably an organic adhesive having heat resistance. Examples thereof include epoxy adhesives and acrylic adhesives. Furthermore, the refractive index of the adhesive layer 16 is a value between the refractive index of the supporting substrate 12 and the refractive index of the piezoelectric substrate 14. The thickness of the adhesive layer 16 is 1 μm or less, and preferably 0.2 to 0.6 μm.

Figure 2:
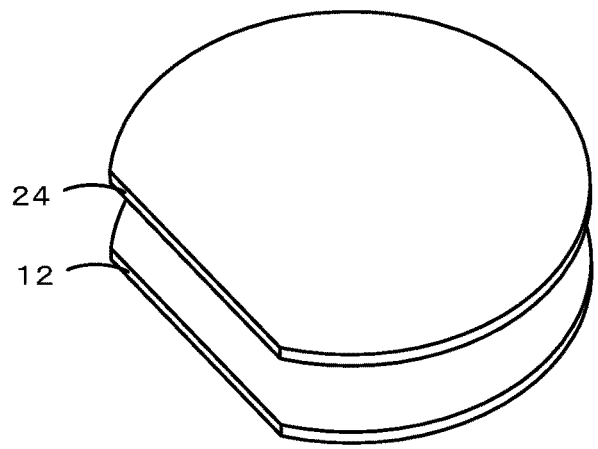
FIG. 2 includes perspective views showing manufacturing steps of the composite substrate 10.
Figure 2:
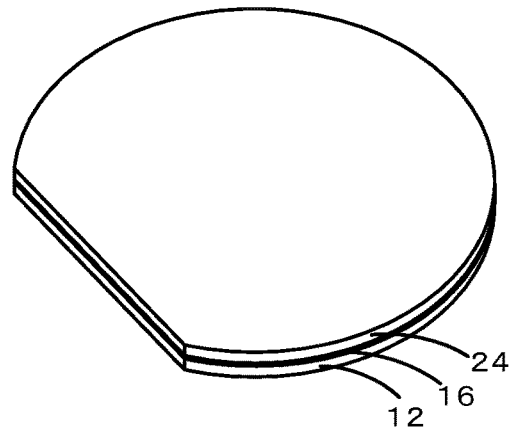
Figure 2:
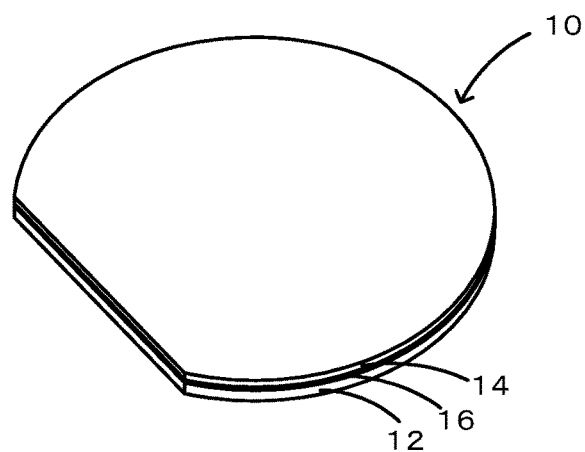

An example of a manufacturing method of such a composite substrate 10 will be described below with reference to FIG. 2. FIG. 2 includes perspective views showing manufacturing steps of the composite substrate 10. First, a supporting substrate 12 having an OF and having a predetermined diameter and thickness is prepared. Furthermore, a piezoelectric substrate 24 having the same diameter as that of the supporting substrate 12 is prepared (refer to FIG. 2(a)). The piezoelectric substrate 24 is thicker than a piezoelectric substrate 14. An adhesive is uniformly applied to at least one of the front surface of the supporting substrate 12 and the back surface of the piezoelectric substrate 24. Then, the substrates 12 and 24 are bonded together. In the case where the adhesive is a thermosetting resin, it is cured by heating, and in the case where the adhesive is a photocurable resin, it is cured by irradiation with light. Thus, an adhesive layer 16 is formed (refer to FIG. 2(b)). Subsequently, by subjecting the piezoelectric substrate 24 to grinding with a grinding machine so as to reduce the thickness to a predetermined value, the piezoelectric substrate 14 is formed. Thus, the composite substrate 10 is obtained (refer to FIG. 2(c)).

Figure 3:
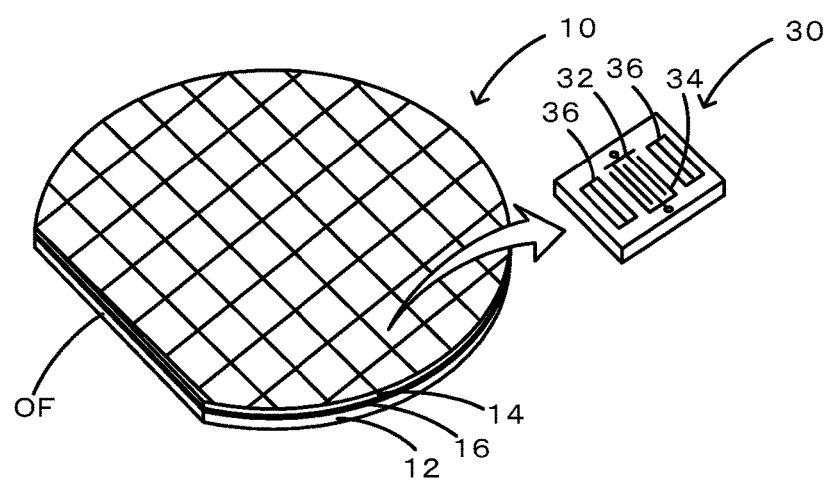
FIG. 3 is a perspective view of a 1-port SAW resonator 30 fabricated using the composite substrate 10.

Electrodes are formed on the resulting composite substrate 10 using a common photolithographic technique, and the composite substrate 10 is formed into an assemblage of many surface acoustic wave devices, and then, cut into individual surface acoustic wave devices by dicing. FIG. 3 shows the state in which the composite substrate 10 is formed into an assemblage of 1-port SAW resonators 30 which are surface acoustic wave devices. The 1-port SAW resonator 30 includes IDT electrodes 32 and 34 and reflecting electrodes 36 which are formed on the surface of the piezoelectric substrate 14 by a photolithographic technique. The IDT electrodes 32 and 34 are formed, for example, by the method described below. First, a photoresist is applied onto the surface of the piezoelectric substrate 14, and the photoresist is irradiated with light through a photomask. Subsequently, the composite substrate is immersed in a developer to remove an unnecessary photoresist. In the case where the photoresist is a negative resist, portions of the photoresist irradiated with light remain on the piezoelectric substrate 14. On the other hand, in the case where the photoresist is a positive resist, portions of the photoresist not irradiated with light remain on the piezoelectric substrate 14.

Next, an electrode material (e.g., Al) is vapor-deposited over the entire surface, and by removing the photoresist, comb-shaped IDT electrodes 32 and 34 are obtained. The IDT electrode 32 is a plus electrode, the IDT electrode 34 is a minus electrode, and these electrodes are formed by patterning so as to be alternately arranged. The distance between adjacent plus electrodes (period) corresponds to the wavelength $\lambda$, and the value obtained by dividing the acoustic velocity v by the wavelength $\lambda$ corresponds to the resonant frequency fr.

In the composite substrate 10 according to the embodiment described above in detail, since the supporting substrate 12 is composed of a translucent alumina ceramic, alignment is easily performed during FCB compared with the case where the supporting substrate is composed of an opaque ceramic. That is, during FCB, the transparent piezoelectric substrate 14 is placed on the lower side, and the supporting substrate 12 is placed on the upper side. Since the supporting substrate 12 is composed of a translucent ceramic, it is possible to check the position of the piezoelectric substrate 14 (e.g., positions of ball bumps formed of Au provided on the piezoelectric substrate 14) through the supporting substrate 12. Therefore, alignment is easily performed. Furthermore, in the composite substrate 10, the linear transmittance and the total light transmittance from the front of the supporting substrate 12 in the visible light range are 10% or more and 70% or more, respectively. Therefore, the advantage described above can be obtained more reliably.

Furthermore, since the coefficient of thermal expansion of the supporting substrate 12 is smaller than that of the piezoelectric substrate 14, the change in size of the piezoelectric substrate 14 at the time of a temperature change is suppressed by the supporting substrate 12. Consequently, in an elastic wave device fabricated using the composite substrate 10, the change in frequency characteristics with temperature can be suppressed. In particular, in the composite substrate 10, since the coefficient of thermal expansion of the supporting substrate 12 is 4 to 9 ppm/° C., thermal expansion at high temperatures is small, and an excellent temperature characteristic-improving effect is obtained in the elastic wave device.

Furthermore, in the composite substrate 10, the total light transmittance from the front at a wavelength of 200 nm is 80% or more. Therefore, when a photoresist film is formed on the surface of the piezoelectric substrate 24, and then exposure is performed on the photoresist film using UV with a wavelength in the vicinity of 200 nm, reflection at the interface between the piezoelectric substrate 24 and the supporting substrate 12 is suppressed, enabling high-accuracy patterning. Furthermore, since the resolution of an exposure apparatus is defined by k×$\lambda$/NA (where k denotes a coefficient, $\lambda$ denotes a wavelength of a light source, and NA denotes a numerical aperture of a projection lens), a fine pattern can be formed by performing exposure with a short wavelength.

Furthermore, since the refractive index of the adhesive layer 16 is a value between the refractive index of the supporting substrate 12 and the refractive index of the piezoelectric substrate 14, light radiated from above the piezoelectric substrate 14 is likely to pass through the adhesive layer 16 and the supporting substrate 12.

Furthermore, since the average crystal grain size of the supporting substrate 12 is small at 10 to 50 μm, unwanted reflection of bulk waves can be reduced. Furthermore, the UV transmittance and strength are increased.

The present invention is not limited to the above-described embodiment. It is clear that the present invention can be implemented in a variety of embodiments without departing from the technical scope thereof.

For example, in the embodiment described above, the case where a surface acoustic wave device, which is an elastic wave device, is fabricated using the composite substrate 10 is described. However, another elastic wave device, such as a Lamb wave device or film bulk acoustic resonator (FBAR), may be fabricated using the composite substrate 10.

In the embodiment described above, the supporting substrate 12 and the piezoelectric substrate 14 are bonded to each other by the adhesive layer 16 to form the composite substrate 10. However, the supporting substrate 12 and the piezoelectric substrate 14 may be directly bonded to each other to form a composite substrate. In the case where the substrates 12 and 14 are directly bonded to each other, for example, the method described below may be used. That is, first, bonding surfaces of the substrates 12 and 14 are washed to remove impurities (oxides, adsorbates, and the like) attached to the bonding surfaces. Next, by irradiating the bonding surfaces of the substrates 12 and 14 with ion beams of inert gas, such as argon, remaining impurities are removed and the bonding surfaces are activated. Then, the substrates 12 and 14 are bonded to each other, in vacuum, at normal temperature.

Figure 7:
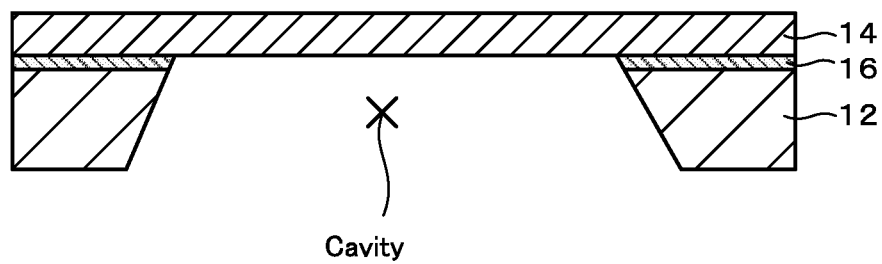
FIG. 7 is a schematic view illustrating a supporting substrate 12 provided with a cavity.

In the embodiment described above, the supporting substrate 12 may be provided with a cavity as shown in FIG. 7. The supporting substrate 12 is obtained by forming starting materials for a translucent alumina ceramic into a predetermined shape, followed by firing. Accordingly, when a supporting substrate 12 provided with a cavity is formed, a mold by which a formed body provided with a cavity can be obtained is used. Consequently, masking and etching steps are not required. For example, in the case where a silicon substrate, not a translucent alumina ceramic substrate, is used as the supporting substrate 12, a series of steps are required to form a cavity in the silicon substrate, which include, first, covering one surface (a surface opposite the surface that is to be bonded to a piezoelectric substrate) of the silicon substrate with a mask, exposing/developing the mask, and then etching portions not covered with the mask.

In the embodiment described above, the supporting substrate 12 is a translucent alumina ceramic substrate. However, the supporting substrate 12 may be a translucent ceramic substrate other than alumina. In such a case, it is also possible to obtain the effect of easily performing alignment during FCB.

EXAMPLES

Translucent Alumina Substrates (Supporting Substrates A to C)

A translucent alumina substrate with a diameter $\phi$ of 100 mm was prepared by the process described below. First, a slurry was prepared in which components shown in Table 1 were mixed. The α-alumina powder used had a specific surface of 3.5 to 4.5 m²/g and an average primary particle size of 0.35 to 0.45 μm.

TABLE 1

| | Component | Part by weight |
|---|---|---|
| Raw powder | $Al_2O_3$ (α-alumina powder) | 100 |
| | MgO (Magnesia) | 0.025 |
| | $ZrO_2$ (Zirconia) | 0.040 |
| | $Y_2O_3$ (Yttria) | 0.0015 |
| Dispersion medium | Glutaric acid dimethyl ester | 27 |
| | Ethylene glycol | 0.3 |
| Gelling agent | MDI resin | 4 |
| Dispersant | Polymer surfactant | 3 |
| Catalyst | N,N-dimethylamino hexanol | 0.1 |

The slurry was poured into a mold made of an aluminum alloy at room temperature and then left to stand at room temperature for one hour. Next, the slurry was left to stand at 40° C. for 30 minutes to cause solidification to proceed and then released from the mold. Furthermore, the solidified slurry was left to stand at room temperature and at 90° C., each for 2 hours, and thereby, a plate-shaped powder formed body was obtained. The resulting powder formed body was calcined (preliminarily fired) in air at 1,100° C. Then, the calcined body was placed on a plate made of molybdenum, and, with a gap of 0.1 to 0.5 mm being provided on the upper side, firing was performed in an atmosphere of hydrogen:nitrogen=3:1 (volume ratio) at 1,700° C. to 1,800° C. Then, the fired body was placed on a plate made of molybdenum, and a weight made of molybdenum was further placed thereon. In that state, annealing treatment was performed in an atmosphere of hydrogen:nitrogen=3:1 (volume ratio) at 1,700° C. to 1,800° C. By providing the gap on the upper side during firing, additives (mainly, magnesia and the like) were released, and by performing annealing at the same temperature as the firing temperature with the weight being placed (with a load being applied) during the annealing treatment, densification was promoted. In such a manner, a translucent alumina substrate was obtained.

Figure 4:
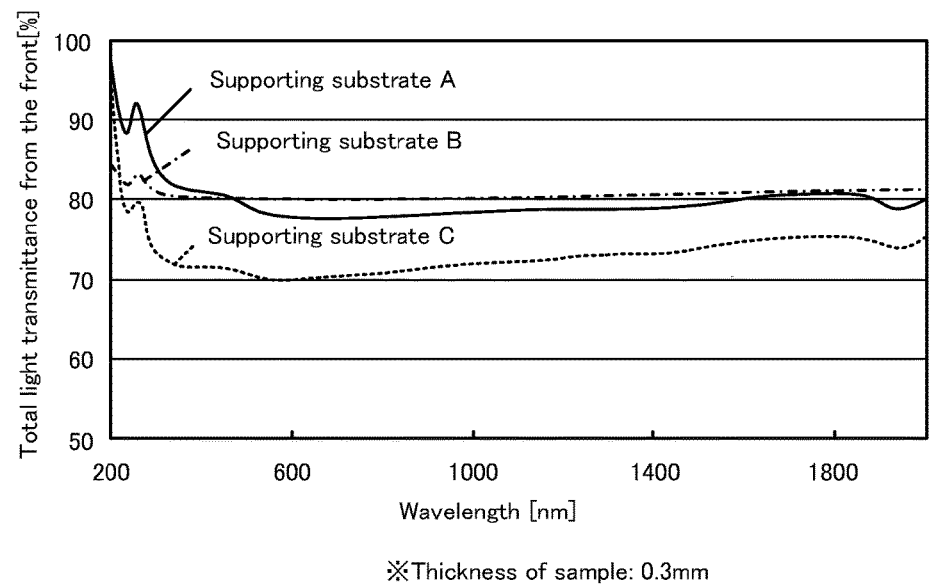
FIG. 4 is a graph showing spectra of total light transmittance from the front of supporting substrates A to C.

Three such translucent alumina substrates were prepared. Both surfaces of the first translucent alumina substrate were subjected to grinding to form a supporting substrate (hereinafter, referred to as the "supporting substrate A"). Both surfaces of the second translucent alumina substrate were subjected to polishing to form a supporting substrate (hereinafter, referred to as the "supporting substrate B"). One surface of the third translucent alumina substrate was subjected to polishing, and the other surface thereof was subjected to grinding to form a supporting substrate (hereinafter, referred to as the "supporting substrate C"). The grinding was performed using diamond abrasive grains and a grindstone #1500. In the polishing, the surface which had been ground was subjected to lapping using diamond abrasive grains with an average grain size of 0.5 μm, and the surface was further subjected to polishing using a colloidal silica slurry and a rigid urethane pad. For each supporting substrate, the arithmetic average roughness (Ra) was measured with a stylus-type surface roughness meter. Furthermore, the total light transmittance from the front was measured using a measurement device 40 shown in FIG. 5, which will be described later. The results thereof are shown in Table 2. Furthermore, FIG. 4 is a graph showing spectra of total light transmittance from the front. Moreover, the average crystal grain size, the coefficient of thermal expansion, and the linear transmittance in the visible light range of each supporting substrate were measured. The results thereof are also shown in Table 2.

Figure 5:
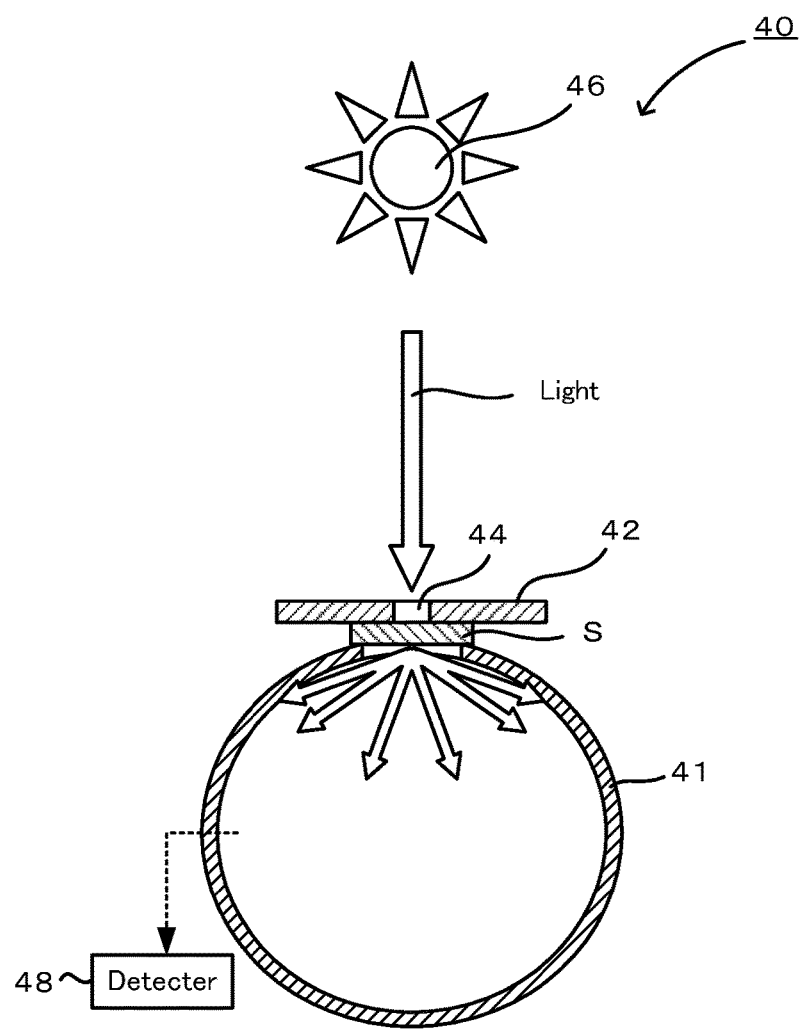
FIG. 5 is a diagram illustrating a measurement device 40.
Figure 6:
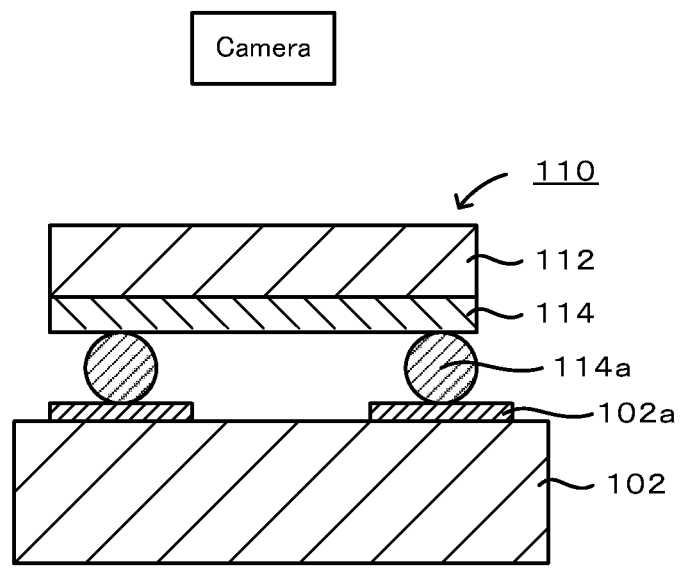
FIG. 6 is a diagram illustrating a state in which a composite substrate 110 is mounted on a printed circuit board 102.

The total light transmittance from the front was calculated on the basis of measured values obtained by a measurement device 40 shown in FIG. 5. In the measurement device shown in FIG. 5, an opening of an integrating sphere 41 is covered with a sample S (thickness: 3 mm), and a plate 42 having a hole 44 (diameter φ: 3 mm) is placed on the upper surface of the sample S. In that state, light from a light source 46 is made to be incident on the sample S through the hole 44. The light having passed through the sample S is collected using the integrating sphere 41, and the intensity of light is measured with a detector 48. The total light transmittance from the front was calculated in accordance to the formula:

Total light transmittance from the front=100×(intensity of light measured)/(intensity of light source).

TABLE 2

| | | Supporting substrate A | Supporting substrate B | Supporting substrate C |
|---|---|---|---|---|
| Average crystal grain size (μm) | | 30 | 30 | 30 |
| Coefficient of thermal expansion (ppm/° C.) | | 6.0 | 6.0 | 6.0 |
| Arithmetic average roughness Ra (nm) | | 5 | 1 | Polished surface: 1 Ground surface: 10 |
| Linear transmittance (%) | 500 nm[×1] | 12 | 15 | 10 |
| Total light transmittance from the front (%) | 200 nm[×1] | 97 | 85 | 94 |
| | 300 nm[×1] | 85 | 82 | 75 |
| | 600 nm[×1] | 77 | 80 | 70 |
| | 1000 nm[×1] | 78 | 80 | 72 |
| | 1400 nm[×1] | 79 | 80 | 74 |

[×1] = Wavelength used for measurement

Example 1

Composite Substrate

An epoxy adhesive with a refractive index of 1.9 was applied onto the supporting substrate A at a thickness of 1 μm or less using a spinner. When the refractive index of the adhesive is between $LiTaO_3$ (refractive index 2.1) and translucent alumina (refractive index 1.7), light radiated from above $LiTaO_3$ becomes likely to pass through the adhesive layer and the supporting substrate A (light transmittance improves). Therefore, an epoxy adhesive with a refractive index of 1.9 was used. A separately prepared 42Y—X $LiTaO_3$ piezoelectric substrate (42° Y-cut X-propagation $LiTaO_3$ piezoelectric substrate in which the cutting angle is rotated Y cut) with a thickness of 230 μm was bonded to the supporting substrate A, and firing was performed at a low temperature of about 150° C. The surface of the piezoelectric substrate was subjected to rough grinding with a grinder, and the thickness of the piezoelectric substrate was reduced to 25 µm. Furthermore, the surface was subjected to precision polishing using colloidal silica and a rigid urethane pad, and a mirror surface was obtained. At this time, the thickness of the piezoelectric substrate was 20 µm. Lastly, the bonded substrate was placed in an oven at 250° C., and the adhesive was completely cured. Thus, a composite substrate was obtained.

Comb-shaped IDT electrodes composed of aluminum were formed on the piezoelectric substrate of the resulting composite substrate through a photolithographic process. Thus, a SAW resonator was obtained. The IDT electrodes were formed by a lift-off method using an ArF exposure apparatus with a wavelength of 193 nm. In the lift-off method, first, a negative resist was applied onto the surface of the piezoelectric substrate, and the negative resist was irradiated with light through a photomask. Then, the composite substrate was immersed in a developer to remove an unnecessary negative resist. Thereby, portions of the negative resist irradiated with light remained on the piezoelectric substrate. Next, Al serving as an electrode material was vapor-deposited over the entire surface, and by removing the negative resist, IDT electrodes with an intended pattern were obtained. The IDT electrode period was set at 4.5 µm. The resulting SAW resonator was measured with a network analyzer, and the resonant frequency was found at around 920 MHz at room temperature. Furthermore, the SAW resonator was placed in a thermostatic chamber, and while changing the temperature from −20° C. to 90° C., resonant frequencies were measured. The TCF (temperature coefficient of frequency) calculated from the measured data was −25 ppm/° C. The temperature characteristic was improved by about 15 ppm/° C. compared with a SAW resonator including an LT single substrate. By using short-wavelength light, patterning accuracy was improved, and a variation in the resonator frequency in response to a variation in the electrode period was reduced.

Comparative Example 1

Composite Substrate

A composite substrate was fabricated by the same fabrication method as that of Example 1 except that, instead of the translucent alumina substrate, a Si substrate was used as the supporting substrate, and a SAW resonator was formed on the piezoelectric substrate. When exposure was performed in the photolithographic process, UV light was reflected at the bonding interface between the piezoelectric substrate and the supporting substrate, and patterning accuracy of IDT electrodes was degraded compared with Example 1. Accordingly, the variation in the resonant frequency increased compared with Example 1.

The present application claims priority from U.S. Provisional Patent Application No. 61/658,988 filed on Jun. 13, 2012, the entire contents of which are incorporated herein by reference.

INDUSTRIAL APPLICABILITY

The present invention is applicable to elastic wave devices, such as surface acoustic wave devices, Lamb wave devices, and film bulk acoustic resonators (FBARs).

What is claimed is:

1. A composite substrate comprising a supporting substrate and a piezoelectric substrate which are bonded to each other through an adhesive layer,
wherein the supporting substrate is composed of a translucent alumina ceramic, wherein the average grain size of the translucent alumina ceramic is 10 to 50 µm and wherein the refractive index of the adhesive layer is between the refractive index of the supporting substrate and the refractive index of the piezoelectric substrate.

2. The composite substrate according to claim 1,
wherein the linear transmittance and the total light transmittance from the front of the supporting substrate in the visible light range (360 to 750 nm) are 10% or more and 70% or more, respectively.

3. The composite substrate according to claim 1,
wherein the total light transmittance from the front of the supporting substrate at a wavelength of 200 nm is 80% or more.

4. The composite substrate according to claim 3,
wherein at least one of front and back surfaces of the supporting substrate has an arithmetic average roughness Ra of 5 to 20 nm.

5. The composite substrate according to claim 1,
wherein the supporting substrate is provided with a cavity.

6. The composite substrate according to claim 1, wherein the supporting substrate and the piezoelectric substrate are directly bonded to each other.

7. The composite substrate according to claim 6, wherein the direct bonding comprises bonding the supporting substrate and the piezoelectric substrate in vacuum after the bonding surfaces of the substrates are activated by irradiating the substrates with ion beams of inert gas.

* * * * *